(12) United States Patent
Chen et al.

(10) Patent No.: US 9,653,505 B2
(45) Date of Patent: May 16, 2017

(54) METHOD FOR FABRICATING PHOTO DETECTOR HAVING SENSOR ELEMENT ARRAY AND PHOTO CONVERSION ELEMENT

(71) Applicant: Au Optronics Corporation, Hsinchu (TW)

(72) Inventors: Te-Ming Chen, Hsinchu County (TW); Chin-Mao Lin, Chiayi (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 15/047,628

(22) Filed: Feb. 19, 2016

(65) Prior Publication Data

US 2016/0172400 A1 Jun. 16, 2016

Related U.S. Application Data

(62) Division of application No. 14/284,406, filed on May 22, 2014, now Pat. No. 9,312,423.

(30) Foreign Application Priority Data

May 24, 2013 (TW) .............................. 102118464 A

(51) Int. Cl.
*H01L 31/115* (2006.01)
*H01L 27/146* (2006.01)
*H01L 31/0232* (2014.01)

(52) U.S. Cl.
CPC .. *H01L 27/14625* (2013.01); *H01L 27/14629* (2013.01); *H01L 27/14645* (2013.01); *H01L 27/14663* (2013.01); *H01L 27/14685* (2013.01); *H01L 27/14687* (2013.01); *H01L 27/14692* (2013.01); *H01L 31/02322* (2013.01); *H01L 31/115* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 2012/0193543 A1* | 8/2012 | Kaneko | C23C 14/0694 250/369 |
| 2012/0267539 A1* | 10/2012 | Shinba | G01T 1/2018 250/366 |

* cited by examiner

*Primary Examiner* — Bilkis Jahan
(74) *Attorney, Agent, or Firm* — Jianq Chyun IP Office

(57) ABSTRACT

A photo detector and a method for fabricating the same are provided. The photo detector includes a first substrate and a photo conversion element. The first substrate has a sensor element array for receiving a light with a spectrum in a specific wavelength range. The photo conversion element is disposed on the sensor element array, where the photo conversion element includes a photo conversion material layer and a doped photo conversion material column structure layer. A luminescent spectrum of the doped photo conversion material layer column structure layer is overlapped with the spectrum in a specific wavelength range, and a luminescent spectrum of the photo conversion material layer is non-overlapped with the spectrum in a specific wavelength range.

6 Claims, 4 Drawing Sheets

METHOD FOR FABRICATING PHOTO DETECTOR HAVING SENSOR ELEMENT ARRAY AND PHOTO CONVERSION ELEMENT

CROSS-REFERENCE TO RELATED APPLICATION

This is a divisional application of and claims the priority benefit of U.S. application Ser. No. 14/284,406, filed on May 22, 2014, now allowed. The prior application Ser. No. 14/284,406 claims the priority benefit of Taiwan application serial no. 102118464, filed on May 24, 2013. The entirety of each of the above-mentioned patent applications is hereby incorporated by reference herein and made a part of this specification.

BACKGROUND

Technical Field

The invention relates to a photo detector and a method for fabricating the same. Particularly, the invention relates to a photo detector having a photo conversion element and a method for fabricating the same.

Related Art

Since a photo detector can absorb light energy and convert the same into electrical signals, and accordingly measure a luminous flux or a light power, it is widely applied in various domains such as digital cameras, video cameras, night vision goggles, automatic lighting equipment, security system, etc. A photo conversion material with column structures is one of the commonly used photo conversion materials. However, in the conventional technique, in an initial stage of depositing the photo conversion material with the column structures, irregular grains are formed to cause a problem of light scattering, which degrades an image resolution.

SUMMARY

The invention is directed to a photo detector and a method for fabricating the same, which is capable of mitigating a problem of light scattering so as to increase an image resolution.

The invention provides a photo detector including a first substrate and a photo conversion element. The first substrate has a sensor element array for receiving light with a spectrum in a specific wavelength range. The photo conversion element is disposed on the sensor element array, where the photo conversion element includes a photo conversion material layer and a doped photo conversion material column structure layer. A luminescent spectrum of the doped photo conversion material column structure layer is overlapped with the spectrum in the specific wavelength range, and a luminescent spectrum of the photo conversion material layer is non-overlapped with the spectrum in the specific wavelength range.

The invention provides a method for fabricating a photo detector, which includes following steps. A first substrate is provided. A sensor element array is formed on the first substrate. A photo conversion element is formed on the sensor element array, where the photo conversion element includes a photo conversion material layer and a doped photo conversion material column structure layer.

According to the above descriptions, in the photo detector and the method for fabricating the same, the photo conversion element includes the photo conversion material layer and the doped photo conversion material column structure layer, where the luminescent spectrum of the doped photo conversion material column structure layer is overlapped with the spectrum in the specific wavelength range, and the luminescent spectrum of the photo conversion material layer is non-overlapped with the spectrum in the specific wavelength range. Before the doped photo conversion material column structure layer is formed, since the photo conversion material layer having better column structures is first formed, and then the doped photo conversion material column structure layer is formed on the photo conversion material layer, it is avoided to form irregular grains in an initial stage of depositing the doped photo conversion material column structure layer, so as to mitigate a problem of light scattering to increase image resolution.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

FIG. 1A to FIG. 1E are cross-sectional view of a method for fabricating a photo detector 50 according to an embodiment of the invention.

Figure 1A:
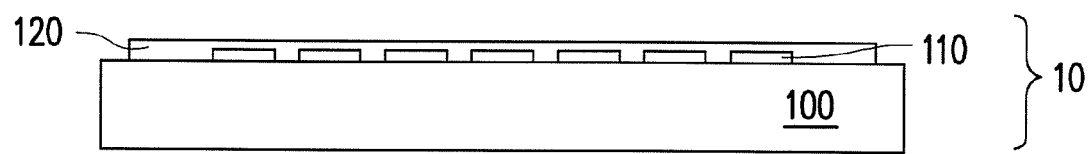
FIG. 1A to FIG. 1E are cross-sectional view of a method for fabricating a photo detector according to an embodiment of the invention.

Referring to FIG. 1A, first, a substrate 100 is provided. The substrate 100 can be a non-reflective substrate (for example, a glass substrate, a carbon substrate or other substrate with a non-reflective material) or a reflective substrate (for example, an aluminium substrate or other substrate with a reflective material). A sensor element array 110 is formed on the substrate 100, where the sensor element array 110 is used to receive light with a spectrum in a specific wavelength range. For example, the sensor element array 110 may include an amorphous silicon photodiode, and an absorption spectrum thereof is within a wavelength range between 450 nm and 620 nm. Then, a passivation layer 120 is formed on the substrate 100 having the sensor element array 110, where the passivation layer 120 at least covers the sensor element array 110. A material of the passivation layer 120 is, for example, silicon nitride, silicon oxide, silicon oxynitride or other material with better light transmittance, and a fabricating method thereof is, for example, chemical vapor deposition or other suitable fabricating methods. In this way, a first substrate 10 of the present embodiment includes the substrate 100, the sensor element array 110 and the passivation layer 120.

Figure 1B:
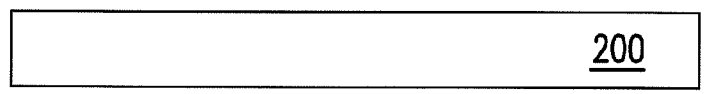

Referring to FIG. 1B, another substrate 200 is provided. The substrate 200 can be a non-reflective substrate (for example, a glass substrate, a carbon substrate or other substrate with a non-reflective material) or a reflective substrate (for example, an aluminium substrate or other substrate with a reflective material).

Figure 1C:
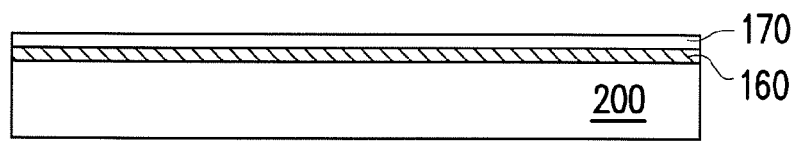

Then, referring to FIG. 1C, in an embodiment, when the substrate 200 is a non-reflective substrate (for example, a glass substrate, a carbon substrate or other substrate with a non-reflective material), a reflective layer 160 is preferably foil led on the substrate 200. The reflection layer 160 is pervious to light with a spectrum of a specific wavelength range and reflects light with a spectrum of other wavelength ranges. For example, the reflective layer 160 can be designed to be pervious to X-ray and reflect visible lights. A material of the reflective layer 160, for example, includes aluminium, silver, chromium, copper, nickel, titanium, magnesium, platinum, gold or other metal, and a fabricating method thereof is, for example, chemical vapor deposition or physical vapor deposition. However, the invention is not limited thereto, and in another embodiment, when the substrate 200 is a reflective substrate (for example, an aluminium substrate or other substrate with a reflective material), it is unnecessary to additionally form the reflective layer 160 on the substrate 200. It should be noticed that the aluminium substrate preferably has a smaller roughness (such as a mirror surface), such that the substrate 200 can effectively reflect light of a specific wavelength (for example, the visible light). Then, a passivation layer 170 is formed on the reflective layer 160, and the passivation layer 170 is used to prevent the reflection layer 160 from interacting with a photo conversion element formed later. A material of the passivation layer 170 is, for example, silicon dioxide, titanium dioxide, aluminium oxide, magnesium oxide and silicon nitride, or other materials with better light transmittance, and a fabricating method thereof is, for example, chemical vapor deposition, physical vapor deposition or spin coating.

Figure 1D:
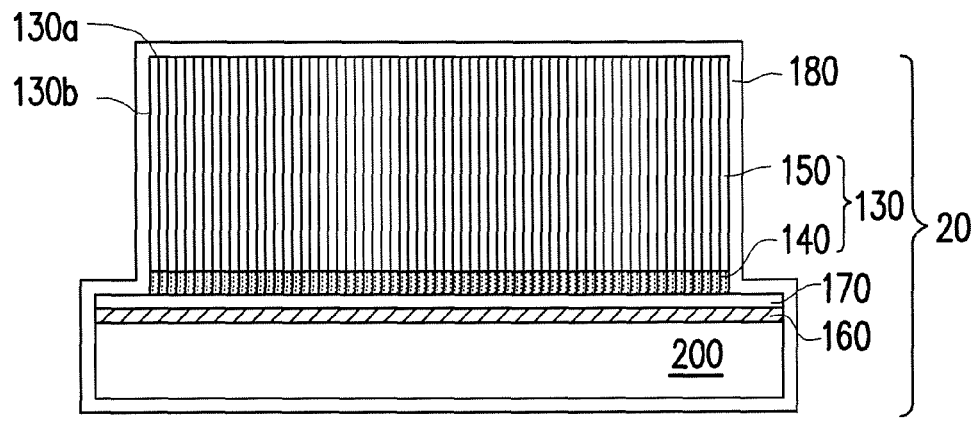

Referring to FIG. 1D, a photo conversion element 130 is then formed on the passivation layer 170, and the photo conversion element 130 can convert light of a specific wavelength range into light of another specific wavelength range. For example, the photo conversion element 130 is a scintillator, which is capable of converting an X-ray into visible light. In the present invention, the photo conversion element 130 includes a photo conversion material layer 140 and a doped photo conversion material column structure layer 150. A thickness of the photo conversion material layer 140 is substantially between 10 μm and 100 μm, and a thickness of the doped photo conversion material column structure layer 150 is substantially between 100 μm and 1000 μm. In an embodiment, a material of the photo conversion material layer 140 includes pure cesium iodide (CsI), and a radiation spectrum thereof is about 290 nm-340 nm. A material of the doped photo conversion material column structure layer 150 is cesium iodide doped with thallium (CsI:Tl) or cesium iodide doped with sodium (CsI:Na). A radiation spectrum of the CsI:Tl is about 450 nm-650 nm, and a ration spectrum of the CsI:Na is about 370 nm-500 nm. According to another embodiment, the doped photo conversion material column structure layer 150 can be further doped with europium ions (Eu+) or samarium ions (Sm+). Since the Eu+ and the Sm+ and the CsI:Tl radiate a green light, by doping the Eu+ or Sm+ in the CsI:Tl, a glow effect is decreased.

According to the above descriptions, a luminescent spectrum (450 nm-650 nm or 370 nm-500 nm) of the doped photo conversion material column structure layer 150 is overlapped with a spectrum in a specific wavelength range (450 nm-620 nm) that is received by the sensor element array 110, and a luminescent spectrum (290 nm-340 nm) of the photo conversion material layer 140 is non-overlapped with the spectrum in the specific wavelength range (450 nm-620 nm) that is received by the sensor element array 110. In other words, since the luminescent spectrum of the pure CsI is between 290 nm and 340 nm, the luminescent spectrum of the CsI:Tl is between 450 nm and 650 nm, the luminescent spectrum of the CsI:Na is between 370 nm and 500 nm, and the absorption spectrum of the amorphous silicon photodiode of the sensor element array 110 is between 450 nm and 620 nm, when the X-ray passes through the doped photo conversion material column structure layer 150 of the photo conversion element 130, the light (450 nm-650 nm or 370 nm-500 nm) converted from the X-ray can be effectively absorbed by the sensor element array 110, and since the light (290 nm-340 nm) emitted from the photo conversion material layer 140 when the X-ray passes through is unmatched with the absorption spectrum of the sensor element array 110, the light is not absorbed by the sensor element array 110. In this way, the light scattered by the photo conversion material layer 140 having irregular grains and located at a bottom of the photo conversion element 130 is not absorbed by the sensor element array 110, so that detection quality is improved.

Figure 3:
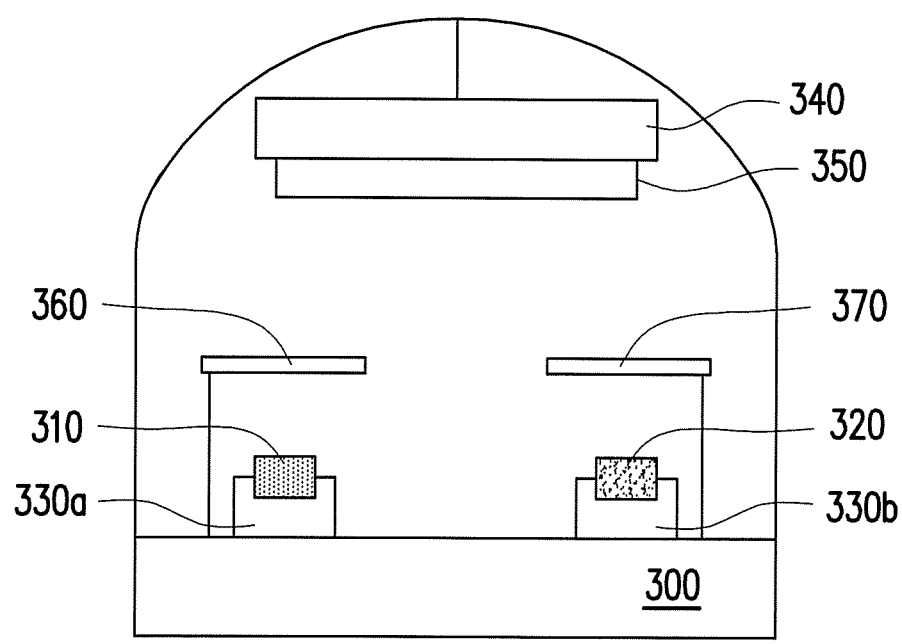
FIG. 3 is a cross-sectional view of an evaporation chamber according to an embodiment of the invention.

A method of forming the photo conversion element 130 includes following steps. As shown in FIG. 3, first, a photo conversion material evaporation source 310 and a dopant material evaporation source 320 are respectively disposed on boats 330a and 330b in an evaporation chamber 300. In an embodiment, the photo conversion material evaporation source 310 includes pure CsI evaporation source, and the dopant material evaporation source 320 includes thallium evaporation source or sodium evaporation source. Moreover, at least one substrate 350 is disposed on an evaporation holder 340 in the evaporation chamber 300. Although only one substrate is illustrated in the evaporation chamber 300 of FIG. 3, the invention is not limited thereto, and more than two substrates can be configured to simultaneously perform the evaporation step. Moreover, in the present embodiment, the substrate 350 is the substrate 200 of FIG. 1C that is already formed with the reflective layer 160 and the passivation layer 170.

The method of forming the photo conversion element 130 of the invention includes an evaporation step and a co-evaporation step. First, the evaporation step is performed on the substrate 350, i.e. a shutter 360 is opened to heat the photo conversion material evaporation source 310, so as to form the photo conversion material layer 140 on the substrate 350. The thickness of the photo conversion material layer 140 formed through the evaporation step is substantially between 10 μm and 100 μm. Then, the co-evaporation step is performed on the substrate 350, i.e. shutters 360 and 370 are simultaneously opened to heat both of the photo conversion material evaporation source 310 and the dopant material evaporation source 320, so as to form the doped photo conversion material column structure layer 150 on the photo conversion material layer 140. The thickness of the doped photo conversion material column structure layer 150 formed through the co-evaporation step is substantially between 100 μm and 1000 μm. Other reaction conditions of the above evaporation step and the co-evaporation step are as follows: a temperature of the substrate 350 is 100-200 degrees Celsius, a temperature of the photo conversion material evaporation source 310 is 620-680 degrees Celsius, an evaporation rate of the dopant material evaporation source 320 is 1-20 Å/sec, and a pressure in the evaporation chamber 300 is 1E-2-1E-4 torr.

After the photo conversion element 130 is formed, referring to FIG. 1D, a cover layer 180 is formed to cover a surface of the whole second substrate 20. However, the invention is not limited thereto. The cover layer 180 can also cover an upper surface 130a and at least one side surface 130b of the photo conversion element 130, only. The cover layer 180 covers the surface of the photo conversion element 130, and prevents the photo conversion element 130 from reacting with moisture and oxygen in the air, so as to effectively prolong a product service life. A material of the cover layer 180 is, for example, glass or polymer, etc. The polymer includes parylene, polyimide (PI) or polyethylene terephthalate (PET), etc. In this way, the second substrate 20 of the present embodiment includes the substrate 200, the reflective layer 160, the passivation layer 170, the photo conversion element 130 and the cover layer 180.

Figure 1E:
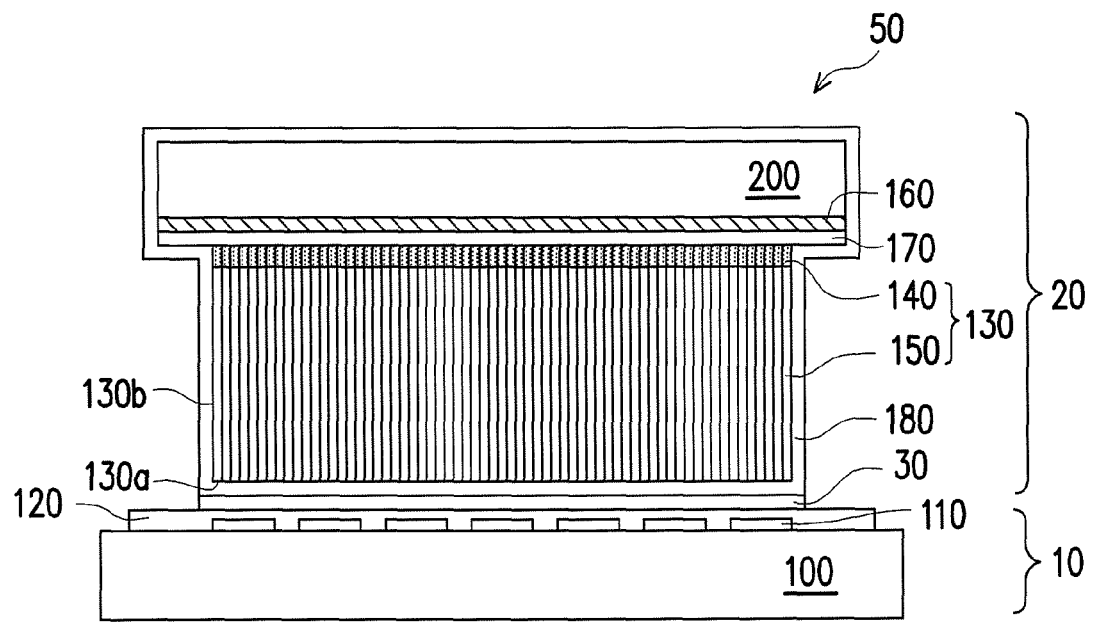

Referring to FIG. 1E, the first substrate 10 of FIG. 1A and the second substrate 20 of FIG. 1D are assembled, and a filling layer 30 is filled between the photo conversion element 130 and the sensor element array 110 to adhere the first substrate 10 and the second substrate 20, so as to form the photo detector 50. In detail, the filling layer 30 is located between the cover layer 180 disposed on the upper surface 130a of the photo conversion element 130 and the passivation layer 120 disposed on the sensor element array 110. The filling layer 30 is, for example, an adhesive material such as a silicon alkyl compound, a UV adhesive, an optically clear adhesive, a glass adhesive or a heat curing adhesive, etc.

According to the embodiment of FIG. 1E, the photo detector 50 includes the substrate 100, the substrate 200 and the photo conversion element 130. The substrate 100 has the sensor element array 110, and the sensor element array 110 is used to receive light with a spectrum in a specific wavelength range. The substrate 200 is disposed opposite to the substrate 100. The photo conversion element 130 is located between the sensor element array 110 and the substrate 200, where the photo conversion element 130 includes the photo conversion material layer 140 and the doped photo conversion material column structure layer 150. The luminescent spectrum of the doped photo conversion material column structure layer 150 is overlapped with the spectrum in the specific wavelength range that is received by the sensor element array 110, and the luminescent spectrum of the photo conversion material layer 140 is non-overlapped with the spectrum in the specific wavelength range that is received by the sensor element array 110. In detail, the photo conversion element 130 is disposed on the substrate 200. The substrate 200 and the photo conversion element 130 may further include the reflective layer 160 there between, and the photo conversion material layer 140 is located between the reflective layer 160 and the doped photo conversion material column structure layer 150. Moreover, the photo detector 50 of the invention may further include the passivation layer 170, the cover layer 180 and the filling layer 30. The passivation layer 170 is located between the reflective layer 160 and the photo conversion element 130. The cover layer 180 covers the upper surface 130a and at least one side surface 130b of the photo conversion element 130. The filling layer 30 fills between the photo conversion element 130 and the sensor element array 110.

It should be noticed that in an embodiment, the photo conversion element 130 in FIG. 1A to FIG. 1E is first formed on the second substrate 20 and is then adhered to the first substrate 10. Namely, the substrate 350 evaporated in the evaporation chamber 300 is the substrate 200 of FIG. 1A that is already formed with the reflective layer 160 and the passivation layer 170. However, the invention is not limited thereto. In another embodiment, the photo conversion element 130 mentioned below (FIG. 2A to FIG. 2B) can also be directly formed on the substrate 100. Namely, the substrate 350 evaporated in the evaporation chamber 300 can also be the substrate 100 (the first substrate 10 shown in FIG. 1A) already formed with the sensor element array 110 and the passivation layer 120.

Figure 2A:
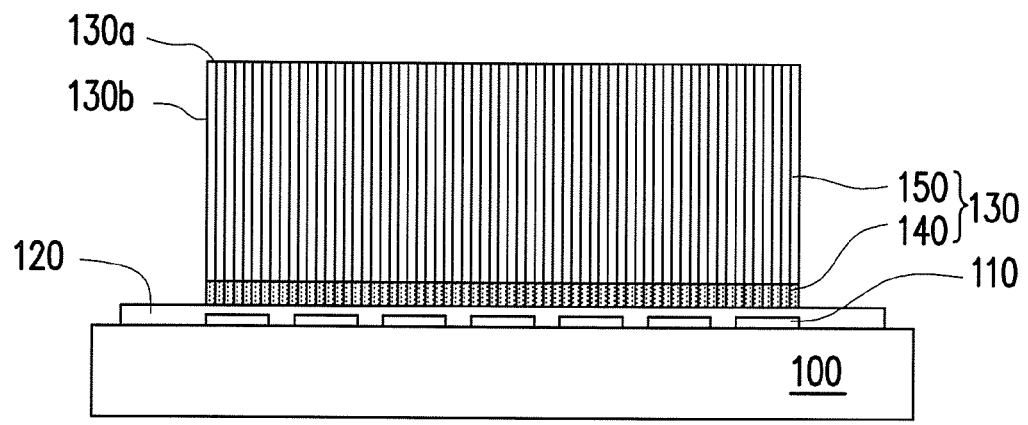
FIG. 2A to FIG. 2B are cross-sectional views illustrating a method for fabricating a photo detector 50' according to another embodiment of the invention.
Figure 2B:
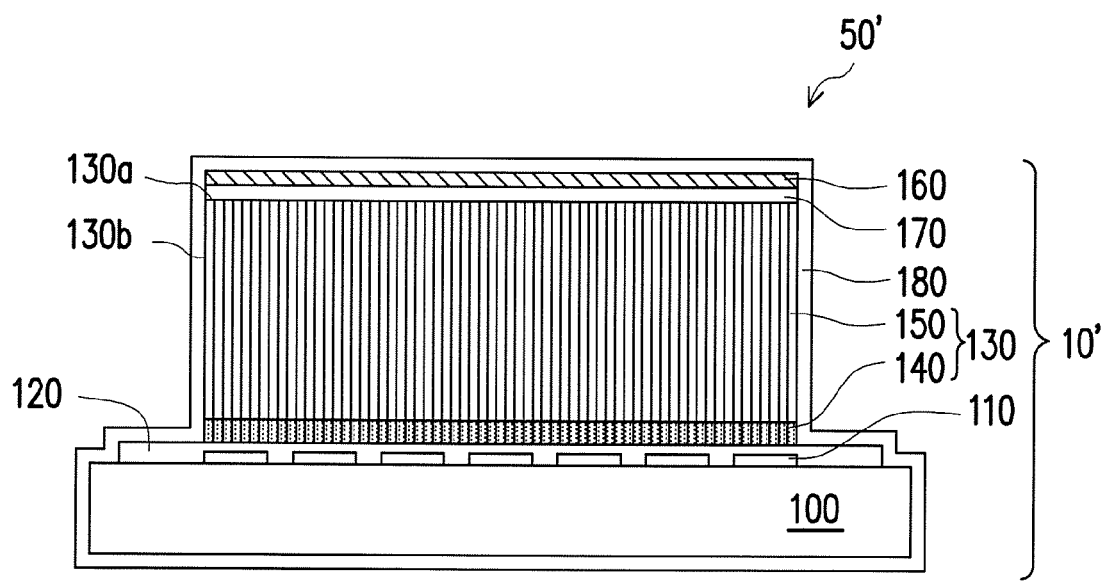

FIG. 2A to FIG. 2B are cross-sectional views illustrating a method for fabricating a photo detector 50' according to another embodiment of the invention. The present embodiment is similar to the embodiment of FIG. 1A to FIG. 1E, and the same referential numbers denote the same components, which are not repeated.

Referring to FIG. 2A, first, the photo conversion element 130 is formed on the substrate 100 that is already formed with the sensor element array 110 and the passivation layer 120. The photo conversion element 130 can be formed by using the evaporation chamber 300 of FIG. 3 to perform the aforementioned evaporation step and co-evaporation step, where the substrate 350 located in the evaporation chamber 300 is the substrate 100 that is already formed with the sensor element array 110 and the passivation layer 120.

After the photo conversion element 130 is formed on the substrate 100 that is already formed with the sensor element array 110 and the passivation layer 120, referring to FIG. 2B, the passivation layer 170 and the reflective layer 160 are sequentially formed on the upper surface 130a of the photo conversion element 130. Then, the cover layer 180 is formed to cover the surface of the whole first substrate 10', so as to form the photo detector 50'. However, the invention is not limited thereto, and the cover layer 180 can also cover the upper surface 130a and at least one side surface 130b of the photo conversion element 130, only. In this way, the first substrate 10' of the present embodiment includes the substrate 100, the sensor element array 110, the passivation layer 120, the photo conversion element 130, the passivation layer 170, the reflective layer 160 and the cover layer 180.

The photo detector 50' of the embodiment of FIG. 2B includes the substrate 100 and the photo conversion element 130. The substrate 100 has the sensor element array 110, and the sensor element array 110 is used to receive light with a spectrum in a specific wavelength range. The photo conversion element 130 is located on the substrate 100 and covers the sensor element array 110, where the photo conversion element 130 includes the photo conversion material layer 140 and the doped photo conversion material column structure layer 150 disposed on the photo conversion material layer 140. The luminescent spectrum of the doped photo conversion material column structure layer 150 is overlapped with the spectrum in the specific wavelength range that is received by the sensor element array 110, and the luminescent spectrum of the photo conversion material layer 140 is non-overlapped with the spectrum in the specific wavelength range that is received by the sensor element array 110. In detail, the photo conversion element 130 is disposed on the sensor element array 110 of the substrate 100. The upper surface 130a of the photo conversion element 130 is covered by the reflective layer 160, and the doped photo conversion material column structure layer 150 is located between the photo conversion material layer 140 and the reflective layer 160. The embodiment of FIG. 2B may further include at least one cover layer 180 covering the reflective layer 160.

In summary, in the photo detector and the method for fabricating the same, the photo conversion element includes the photo conversion material layer (for example, the pure CsI) and the doped photo conversion material column structure layer (for example, CsI:Tl or CsI:Na), where the luminescent spectrum of the doped photo conversion material column structure layer is overlapped with the spectrum in the specific wavelength range that is received by the sensor element array, and the luminescent spectrum of the photo conversion material layer is non-overlapped with the spectrum in the specific wavelength range that is received by the sensor element array. Before the doped photo conversion material column structure layer is formed, since the photo conversion material layer having the column structures is first formed, and then the doped photo conversion material column structure layer is formed on the photo conversion material layer, it is avoided to form irregular grains in an initial stage of depositing the doped photo conversion material column structure layer, so as to mitigate a problem of light scattering to increase image resolution. In the invention, the evaporation step is first performed to form the photo conversion material layer having better column structures, and then the co-evaporation step is performed to form the doped photo conversion material column structure layer having better column structures. In this way, the photo conversion element of the invention has good column structures and an excellent light guiding function.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method for fabricating a photo detector, comprising:
providing a first substrate;
forming a sensor element array on the first substrate;
providing a second substrate;
forming a photo conversion element on the second substrate, wherein the photo conversion element comprises a photo conversion material layer and a doped photo conversion material column structure layer, and a method of forming the photo conversion element comprises:
disposing a photo conversion material evaporation source and a dopant material evaporation source in an evaporation chamber;
installing at least one substrate in the evaporation chamber;
using the photo conversion material evaporation source to perform an evaporation step on the substrate, so as to form the photo conversion material layer on the substrate; and
using the photo conversion material evaporation source and the dopant material evaporation source to perform a co-evaporation step on the substrate, so as to form the doped photo conversion material column structure layer on the photo conversion material layer, wherein during a process of performing the evaporation step and the co-evaporation step, a temperature of the substrate is 100-200 degrees Celsius, a temperature of the photo conversion material evaporation source is 620-680 degrees Celsius, an evaporation rate of the dopant material evaporation source is 1-20 Å/sec, and a pressure in the evaporation chamber is 1E-2-1E-4 torr;
forming, a reflective layer between the second substrate and the photo conversion element, wherein the photo conversion material layer is located between the reflective layer and the doped photo conversion material column structure layer; and
assembling the first substrate and the second substrate, so that the doped photo conversion material column structure layer is located between the photo conversion material layer and the sensor element array.

2. The method for fabricating the photo detector as claimed in claim 1, wherein the photo conversion material evaporation source comprises a pure cesium iodide evaporation source, and the dopant material evaporation source comprises a thallium evaporation source or a sodium evaporation source.

3. The method for fabricating the photo detector as claimed in claim 1, wherein a thickness of the photo conversion material layer is substantially between 10 μm and 100 μm, and a thickness of the doped photo conversion material column structure layer is substantially between 100 μm and 1000 μm.

4. A method for fabricating a photo detector, comprising:
providing a first substrate;
forming a sensor element array on the first substrate;
forming a photo conversion element on the first substrate and covers the sensor element array, wherein the photo conversion element comprises a photo conversion material layer and a doped photo conversion material column structure layer, and a method of forming the photo conversion element comprises:
disposing a photo conversion material evaporation source and a dopant material evaporation source in an evaporation chamber;
installing the first substrate in the evaporation chamber;
using the photo conversion material evaporation source to perform an evaporation step on the first substrate, so as to form the photo conversion material layer on the first substrate; and
using the photo conversion material evaporation source and the dopant material evaporation source to perform a co-evaporation step on the first substrate, so as to form the doped photo conversion material column structure layer on the photo conversion material layer, wherein during a process of performing the evaporation step and the co-evaporation step, a temperature of the substrate is 100-200 degrees Celsius, a temperature of the photo conversion material evaporation source is 620-680 degrees Celsius, an evaporation rate of the dopant material evaporation source is 1-20 Å/sec, and a pressure in the evaporation chamber is 1E-2-1E-4 torr;
forming a reflective layer on the upper surface of the photo conversion element, such that the doped photo conversion material column structure layer is located between the photo conversion material layer and the reflective layer.

5. The method for fabricating the photo detector as claimed in claim 4, wherein the photo conversion material evaporation source comprises a pure cesium iodide evaporation source, and the dopant material evaporation source comprises a thallium evaporation source or a sodium evaporation source.

6. The method for fabricating the photo detector as claimed in claim 4, wherein a thickness of the photo conversion material layer is substantially between 10 μm and 100 μm, and a thickness of the doped photo conversion material column structure layer is substantially between 100 μm and 1000 μm.

* * * * *